United States Patent [19]

Yamamoto et al.

[11] Patent Number: 5,030,616

[45] Date of Patent: Jul. 9, 1991

[54] METHOD FOR PRODUCING AN ELONGATED SINTERED ARTICLE

[75] Inventors: Susumu Yamamoto; Nozomu Kawabe; Shuji Yazu; Tetsuji Jodai, all of Hyogo, Japan

[73] Assignee: Sumitomo Electric Industries, Ltd., Osaka, Japan

[21] Appl. No.: 225,207

[22] Filed: Jul. 28, 1988

[30] Foreign Application Priority Data

Jul. 28, 1987 [JP] Japan ................. 62-188005

[51] Int. Cl.$^5$ ............................. H01L 39/24
[52] U.S. Cl. ............................. 505/1; 29/599; 29/469.5; 228/122; 228/216; 505/705
[58] Field of Search ............. 29/599, 825, 469.5, 29/402.07, 402.09, 402.13, 402.16, 402.21; 174/125.1; 505/705, 1; 228/215, 216, 122, 176, 179

[56] References Cited

U.S. PATENT DOCUMENTS 2,473,879  6/1949  Guarnaschelli ............ 228/215 X
4,704,249 11/1987  Glatzle .
4,752,654  6/1988  Iida et al. .................. 29/599 X

FOREIGN PATENT DOCUMENTS 61-131307  6/1986  Japan .
62-121733  5/1987  Japan .

OTHER PUBLICATIONS

Bednorz, et al., "Possible High $T_c$ Superconductivity in the Ba-La-Cu-O System", Z. Phys. B-Condensed Matter 64, (1986) pp. 189-193.
"Applied Physics Letters", *High Tc Superconductors—Composite Wire Fabrication*, Jin et al., 7/20/87.

*Primary Examiner*—Joseph M. Gorski
*Attorney, Agent, or Firm*—Foley & Lardner

[57] ABSTRACT

Improvement in a method for producing a sintered elongated article by the steps comprising filling a metal pipe with a material powder, carrying out plastic deformation of the metal pipe and then subjecting the material powder in deformed metal pipe to sintering. In the invention, a netting of metallic wire (1) whose melting point is higher than a melting point of the material powder (3) is arranged around the metal pipe (2) before the sintering.

17 Claims, 1 Drawing Sheet

METHOD FOR PRODUCING AN ELONGATED SINTERED ARTICLE

BACKGROUND OF THE INVENTION

1. Field of the Invention

The present invention relates to a method for producing an elongated article article. More particularly, it relates to a method for producing an elongated sintered article in a form of wire, rod, tape or the like from a powder material.

The method according to the present invention is applicable to so called new ceramics, fine ceramics or sintered alloys which are difficult of shaping or molding by the conventional techniques such as wiredrawing, rolling or extrusion.

The method according to the present invention is advantageously applicable for manufacturing a superconducting wire.

2. Description of the Related Art

New ceramics, fine ceramics and sintered alloys possess a wide variety of functions, and hence their applications are spreading over a variety of industrial fields. They have a high thermal conductivity and a high resistance to chemicals. In addition to these inherent properties, some ceramics possess the other unique properties. In fact, transparent ceramics, histocompatible ceramics or electro-conductive ceramics are known. Such variety of the properties or functions come from such a fact that the ceramics are composed of large numbers of elements which can be combined in a wide range.

The term ceramics in this specification implies any sintered article produced through a solid reaction by a sintering technique from a powder material including inorganic powders and metal powders. The ceramics to which the present invention is applicable may be oxide type ceramics such as alumina, beryllia, zirconia, ferrites ($MO,Fe_2O_3$), PLZT (($Pb,La)(Zr,Ti)O_3$) or the like, non-oxide type ceramics such as nitride, for example $Si_3N_4$ or AIN, carbide, for example SiC or WC, boron carbide, carbide precipitating type cobalt-based alloy or the like. Some of them are often called sintered alloys.

Alumina have been one of very popular ceramics used in machine parts and now is used as a substrate material for IC. Silicon carbide and silicon nitride possess high abrasion-resistance and strength in a high temperature range, so that they are used as machine parts used in an internal combustion engine or in a high temperature conveyer machine. Tungsten carbide and the carbide precipitating type cobalt-based alloy possess a very high hardness and stiffness, so that they are used as a cutting tool or a printer head or the like.

However, machining or cutting of these materials are very difficult to perform because of their hardness which is one of their inherent properties. In fact, it is very difficult to cut the sintered bodies of these materials by ordinary cutting tools, so that they have been machined only by electro spark machining technique or diamond cutting technique. In other words, they are impossible or difficult to be deformed or shaped into elongated articles such as tape, wire or pipe by the conventional plastic deformation techniques such as rolling or wire-drawing.

In the conventional technique for producing an elongated article of ceramic, a powder material is molded into a compact at first and then the compact is baked in a sintering furnace in order to minimize a cutting work after a sintering stage. For, example, a ceramic shaft has been produced by such steps that a powder material is molded into a rod having a rectangular cross section in a press and then the resulting molded article is shaped in a trimming step before the press-molded article is passed to a sintering furnace. This conventional technique, however, is not economical because of poor productivity and waste of expensive powder material and also is not suitable for a continuous operation because an elongated article having a long length can not be produced.

In another conventional method for producing a ceramic article, the powder material is blended with organic binder to prepare a paste which can be used in a moulding or shaping stage. Then, the paste molded in a form of rod or tape is heated to remove the binder and then sintered finally. This process much better than the above-mentioned press molding technique but it is difficult to remove the organic binder completely during the intermediate heating stage and hence remain in the finally sintered article, resulting in a cause of defects of the product which will lower the strength and the resistance to flexion.

In the case of sintered metallic alloys such as carbide precipitating type cobalt-based alloy, it is also possible to adopt special techniques such as (i) centrifugal casting process, (ii) rotary spinning process in water and (iii) metal plating process in addition to the above-mentioned techniques for ceramics. However, it is difficult to produce an elongated article of high quality by the centrifugal casting process. The maximum length of a wire produced by the process is limited to 50 cm in case of a diameter of 2 mm. In the case of the rotary spinning process, it is difficult to control precisely a diameter of a wire to be produced and the maximum diameter of the wire is limited to 1 mm. The metal plating process is used for diffusing metal such as Co, W, Cr or the like into a carbon fiber. However, this technique is not only applicable to the other metals but also is poor in productivity.

Conclusively, it is impossible or difficult to manufacture elongated ceramic articles of high quality economically by the conventional techniques, and hence there remains a strong demand to establish an industrial process for manufacturing elongated articles.

The present inventors proposed a unique process for manufacturing an elongated article by the steps comprising filling a metal pipe with a material powder of ceramic, performing plastic deformation of the metal pipe filled with the ceramic metal powder to reduce the cross section of the metal pipe, and then subjecting the deformed metal pipe to heat-treatment to sinter the ceramic material powder filled in the metal pipe in a pending Japanese patent application No. 62-121,733.

This process itself is satisfactory. However, we found such a trouble in this process that, if the pipe is made of a metal such as aluminum whose melting point is low, the metal pipe fuses and dopes off the compacted powder during the sintering stage, resulting in that the metal pipe loses its function as a support. In fact, the sintered wire is apt to break if the support or metallic sheath does not exist, since the sintered mass produced by the process is fragile.

An object of the present invention is to overcome the abovementioned problems of our previous process and to provide an improved process for producing an elongated article covered by a metallic sheath with high quality, reduced loss and higher productivity.

Another object of the present invention to apply the method of the present invention for a production of a superconducting wire of compound oxide.

SUMMARY OF THE INVENTION

The present invention provides an improved method for producing a sintered elongated article by the steps comprising filling a metal pipe with a material powder, carrying out plastic deformation of the metal pipe filled with the material powder and then subjecting the deformed metal pipe filled with the material powder to heat-treatment at a sintering temperature of the material powder. The improvement according to the present invention reside in that a net or netting of metallic wire whose melting point is higher than a melting point of the material powder is arranged around the metal pipe before the heat-treatment.

The material of the metal pipe is selected from metals which can be deformed by plastic deformation works and hence is preferably selected from a group comprising Al, Cu, Ni, Ag, Fe and their alloys.

According to the present invention, the netting of metallic wire whose melting point is higher than a melting point of the material powder is arranged around the metal pipe before the heat-treatment in order to maintain a configuration of the compacted powder material and to prevent molten metal of the metal pipe from dropping off the the compacted powder material. According to the present invention, even if the metal pipe melts, molten metal can be held by the netting of metallic wire, so that a metal layer of the metal pipe is left around the sintered product after the sintered product is cooled down to ambient temperature. The metal layer left functions as a protective sheath or a support of the sintered product.

The material of metallic wire for the netting can be selected from a variety of metals, provided that their melting points are higher than the melting point of the material powder. In a preferred embodiment, the netting may be made of stainless steel.

The plastic deformation is preferably carried out by any one of wire-drawing by dies, wire-drawing by roller dies, wire-drawing by rolls, swaging or extrusion. Selection of the mode of plastic deformation depend on the nature of the material powder and the metal pipe.

The sintering of the powder material can be carried out by the conventional techniques. According to the present invention, the sintering may be carried out even under such a condition that the sintering temperature is higher than a melting point of the metal pipe. If necessary, the metal pipe can be annealed in the stage of the plastic deformation.

The details of the plastic deformation and the sintering of the material powder are described in our co-pending U.S. patent application Ser. No. 152,713 titled "Process for Manufacturing a Superconducting of Wire Compound Oxide-Type Ceramic" filed on Feb. 5, 1988, No. 161,480 titled "Process for Manufacturing a Compound Oxide-Type Superconducting Wire" filed in Feb. 28, 1988,. No. 182,489 titled "Process for Producing Sintered Ceramic Wire" filed on Apr. 16, 1988 and No. 189,366 titled "Process for Manufacturing a Superconducting Composite" filed on May 1, 1988. The contents of specifications of these patent applications are referred in the present application.

The present invention is applicable to a variety of ceramics and sintered alloys which are produced by sintering technique and which are difficult to be machined. The ceramics or sintered alloys which can be processed by the present invention include oxide type ceramics such as alumina, beryllia, zirconia, ferrites $(MO,Fe_2O_3)$, PLZT $((Pb,La)(Zr,Ti)O_3)$ or the like, non-oxide type ceramics such as nitride, for example $Si_3N_4$ or AlN, carbide, for example SiC or WC, boron carbide, carbide precipitating type cobalt-based alloy or the like.

One of preferred applications of the present invention is a production of a superconducting wire of compound oxide.

Thus, after the possibility of an existence of new types of superconducting materials having much higher Tc was revealed by Bednorz and Müller who discovered a new oxide type superconductor in 1986 [Z. Phys. B64 (1986) 189], realization of high temperature superconductors have burst onto the scene.

This new type superconducting material is $[La,Ba]_2CuO_4$ which has a crystal structure of $K_2NiF_4$-type oxide and possesses such higher Tc as 30K which are extremely higher than the known superconducting materials, so that it becomes possible to use liquidized hydrogen (b.p.=20.4K) or liquidized neon (b.p.=27.3K) as a cryogen. It was also reported that C. W. Chu et al, discovered, in the United States of America, another type of superconducting material having the critical temperature of about 90K in Feb. 1987. Still other type new superconducting materials which were reported recently are compound oxides of Bi-Sr-Ca-Cu-O system and Tl-Ba-Ca-Cu-O system which exhibit such high Tc as more than 100K and which are chemically much stable than the abovementioned YBCO type compound.

However, the above mentioned new type superconducting materials are ceramic materials of compound oxides which do not possess such a high plasticity as well-known metal type superconducting materials such as Ni-Ti alloy. They are fragile and are easily broken even under a very weak mechanical stress, so that they can not or are difficult to be shaped or deformed into an elongated article such as a wire by the conventional plastic deformation techniques.

Heretofore, it is proposed, in Japanese patent laid-open No. 61-131,307, a method for manufacturing a superconducting wire from a metal type superconducting material of $PbMo_{0.35}S_8$ by the steps comprising charging the material metal powder in a metal shell, extruding the metal shell filled with the material powder at a temperature which is higher than 1,000° C., and the drawing the extruded composite. This metal working technique, however, can not apply directly to ceramic material consisting of compound oxide, because the compound oxide type superconducting materials can not exhibit the superconductivity if the specified or predetermined crystal structure is not realized. In other words, a superconducting wire which shows a high critical temperature and a high critical current density can not be obtained outside predetermined optimum operational conditions.

Furthermore, a desired polycrystal which possesses a completely uniform crystal structure can not be obtained by a simple sintering process for superconducting particles. Still more, the phenomenon of superconductivity is apt to break down easily in a strong magnetic field and/or under fluctuation or unhomogeneous distribution of temperature in the sintered body and also the abovementioned oxide type superconducting materials possess rather higher specific resistance and lower heat-conductivity. Therefore, if the phenomenon of superconductivity breaks down locally, the sintered body produces the Joule heat caused by the superconducting current preserved internally, so that explosive evaporation of cryogen is induced when the heated portion of the sintered body contacts with the cryogen. In order to avert such danger, in the case of the conventional metal type superconducting materials, they are shaped into a form of a fine wire or filament and are embedded in electroconductive metal such as copper which function as a by-pass of electric current when the superconductivity break down. The oxide type superconducting materials are, however, difficult to be shaped or deformed into such fine filaments, because of their poor plasticity.

In order to realize a reliable and practical superconducting structure, it is indispensable that the structure possesses enough strength and tenacity which is sufficient to endure bending force during usage and also has as finer cross sectional dimension as possible in such manner that it can transmit currency at a high critical current density and at a high critical temperature. However, the conventional techniques can not use or are difficult to produce a wire shaped ceramic article possessing satisfactory mechanical strength and tenacity as well as a high dimensional ratio of a length to a cross section.

Taking the abovementioned situation into consideration, the present inventors have proposed processes and methods for producing sintered ceramic wires having a practically usable high dimensional ratio of the length to the cross section without using organic binder which is a cause of deterioration of strength and tenacity in the above mentioned the U.S. patent application Ser. No. 152,713, No. 161,480, No. 182,489 and No. 189,366.

In these patent applications, a metal pipe filled with powder material is shaped into a desired configuration such as a coil by the plastic deformation before the powder material compacted in the metal pipe is sintered. The metal pipe or sheath surrounding the sintered wire functions as a heat-conductor and as a by-pass when the superconductivity break down. In the process, it is also possible to produce a sintered hollow article if a removable core is placed in the powder material when later is charged in the metal pipe. The present invention provides an improved method of these patent applications.

When a superconducting wire is produced by the present invention, the powder material may be a powder mixture composed of a compound of an element $\alpha$ selected from IIa group of the Periodic Table, a compound of an element $\beta$ selected from IIIa group of the Periodic Table, and a compound of an element $\gamma$ selected from a group comprising Ib, IIb, IIIb, IVa and VIIIa groups of the Periodic Table. More preferably, the powder material is a sintered powder which is prepared by sintering said powder mixture and then pulverizing the resulting sintered mass. The sintered powder is preferably composed of a compound oxide represented by the general formula:

$$(\alpha_{1-x}\beta_x)Cu_yO_z$$

in which $\alpha$ and $\beta$ means the same definition as above, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfy ranges of $0.4 \leq y \leq 3.0$ and $1 \leq z \leq 5$ respectively.

The element $\alpha$ is preferably Ba and the element $\beta$ is preferably at least one element selected from a group comprising Y, La, Gd, Dy, Ho, Er, Tm, Yb, Nd, Sm, Eu and Lu. An atomic ratio of $\alpha$ to $\beta$ depends on type or system of the compound oxide or on the combination of $\alpha$ and $\beta$.

Thus, the preferable compound oxides are Y-Ba-Cu-O system, La-Ba-Cu-O system and La-Sr-Cu-O system including the following special cases:
$Y_1Ba_2Cu_3O_{7-x}$, $Ho_1Ba_2Cu_3O_{7-x}$, $Lu_1Ba_2Cu_3O_{7-x}$, $Sm_1Ba_2Cu_3O_{7-x}$, $Nd_1Ba_2Cu_3O_{7-x}$, $Gd_1Ba_2Cu_3O_{7-x}$, $Eu_1Ba_2Cu_3O_{7-x}$, $Er_1Ba_2Cu_3O_{7-x}$, $Dy_1Ba_2Cu_3O_{7-x}$, $Tm_1Ba_2Cu_3O_{7-x}$, $Yb_1Ba_2Cu_3O_{7-x}$, $La_1Ba_2Cu_3O_{7-x}$, $(La, Sr)_2CuO_{4-x}$
in which x is a number which satisfies a range of $0 < x < 1$.

The above-mentioned compound oxides preferably possess perovskite type or quasi-perovskite type crystal structure. The term quasi-perovskite type means a structure which can be considered to have such a crystal structure that is similar to perovskite-type oxides and includes an orthorhombically distorted perovskite or a distorted oxygen-deficient perovskite or the like.

The sintering operation of the powder mixture is carried out at temperature which is higher than 600° C. but is not higher than the lowest melting point of any component in the material powder to be sintered. If the sintering temperature exceeds the lowest melting point, a liquid phase will be produced, resulting in lowering the superconducting property. To the contrary, if the sintering temperature is not higher than 600° C., a desired sintering reaction for producing a compound oxide can not be achieved. Therefore, higher sintering temperature within the abovementioned range is preferable in order to obtain a superior superconductor. In the conventional process, the upper limit of the sintering temperature is limited to a melting point of the metal pipe so as to prevent melt down of the outer metal pipe. To the contrary, in the case of the present invention, the sintering operation can be performed at a temperature which may be higher than the melting point of the metal pipe and which is most suitable for realizing the superconductor because the compacted powder is supported by the netting of fine metallic wire.

The superconductor to which the present invention is applicable may be another type of compound oxide consisting mainly of a compound oxide represented by the formula:

$$\Theta_4(\Phi_{1-q}Ca_q)_mCu_nO_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p = (6+m+n)$, q is a number which satisfies a range of $0 < q < 1$, and r is a number which satisfies a range of $-2 \leq r \leq +2$. This system is considered to be a single phase of the following compound oxide or a mixed phase consisting mainly thereof:
$Bi_4Sr_4Ca_4Cu_6O_{20-r}$, $Bi_2Sr_2Ca_2Cu_3O_{10-r}$ or $Tl_4Ba_4Ca_4Cu_6O_{20-r}$, $Tl_2Ba_2Ca_2Cu_3O_{10-r}$,
in which r is a number which satisfies a range of $-2 \leq r \leq +2$.

DESCRIPTION OF THE PREFERRED EMBODIMENT

Figure 1:
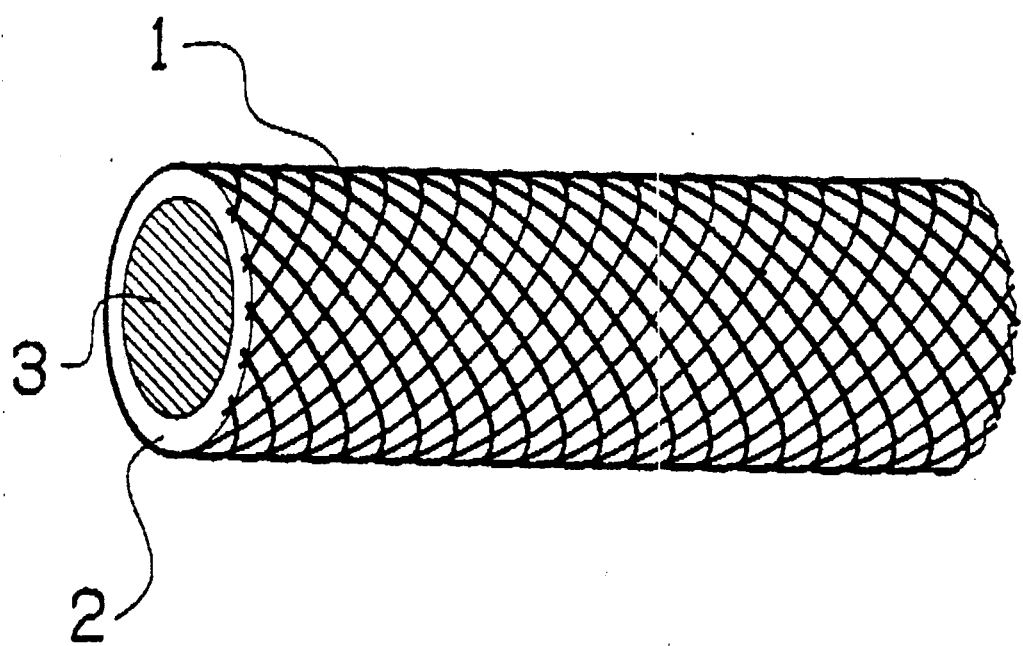
FIG. 1 illustrates a perspective view of a sintered ceramic wire produced according to the present invention.

Referring to FIG. 1, an elongated sintered article produced by the method of the present invention comprises a sintered mass 3 of a material powder, a metal pipe 2 surrounding the sintered mass 3 and a netting 1 arranged around the metal pipe 2.

According to the method of the present invention, after the metal pipe 2 is filled with the material powder, the metal pipe is deformed by a plastic deformation technique, for example by means of a roller dies. Then, a netting of metallic wire is arranged around the metal pipe. The netting can be formed by passing the metal pipe through a conventional wire winding machine which is used in the hose manufacturing industry. In a variation, an elongated cylindrical sleeve of wire netting can be put on the metal pipe, or a band of wire netting can be wound spirally about the metal pipe. Then, the resulting composite is sintered finally.

Now, several embodiments of the method according to the present invention will be described by Examples, but the scope of the present invention should not be limited thereto.

EXAMPLE 1

An aluminum pipe having a length of 1,000 mm, an inner diameter of 4 mm and an outer diameter of 5 mm is filled with a commercially available powder of NiO having a purity of more than 99.9% and opposite ends of the pipe are closed. Then, the aluminum pipe is drawn by a pair of roller dies to reduce its outer diameter to 3.6 mm.

Then, fine stainless steel (SUS 304) wires having a diameter of 0.4 mm are wound around the aluminum pipe at a pitch of 0.4 mm in such a manner that a netting of stainless steel is formed on an outer surface of the aluminum pipe as is shown in FIG. 1. The resulting composite is heated in a sintering furnace at 950° C. for 2 hours. The resulting wire obtained has a length of 1,600 mm and an outer diameter of 4.4 mm.

For comparison, a sample which is prepared in the same condition as above except that the wire netting is not formed around the aluminum pipe.

The result showed that, in the case of the sample having the wire netting according to the present invention, the molten aluminum did not drop off but was held by the wire netting, so that the resulting wire possessed a substantially uniform outer aluminum layer.

To the contrary, in the case of the comparative sample, molten aluminum drop off the sintered mass at several locations, so that the resulting outer aluminum layer had not a uniform wall thickness but varied from 0.02 mm to 0.1 mm.

EXAMPLE 2

Powders of $BaCO_3$, $Y_2O_3$ and CuO each having a purity of more than 99.9% are prepared. After they are mixed in such a proportion by weight as 20.9% of $Y_2O_3$, 54.7% of $Ba_2CO_3$ and 24.5% of CuO, they are kneaded in a wet mill and then dried. The resulting powder mixture is moulded in a press under a pressure of 100 kg/cm$^2$ to produce a compact. The compact is sintered at 880° C. for 8 hours and then pulverized to reduce under 100 mesh. The steps from the compacting to pulverization are repeated for three times.

The resulting fine sintered powder is compacted in an aluminum pipe having an outer diameter of 5 mm, an inner diameter of 4 mm and a length of 1,000 mm and opposite ends of the pipe are closed. The, the pipe is drawn through a die to reduce its outer diameter to 3.6 mm.

Then, fine stainless steel (SUS 304) wires having a diameter of 0.4 mm are wound around the aluminum pipe at a pitch of 0.4 mm in such a manner that a netting of stainless steel is formed on an outer surface of the aluminum pipe as is shown in FIG. 1. The resulting composite is heated in a sintering furnace at 930° C. for 3 hours. The resulting wire obtained has a length of 1,600 mm and an outer diameter of 4.4 mm.

For comparison, a sample which is prepared in the same condition as above except that the wire netting is not formed around the aluminum pipe.

The result showed that, in the case of the sample having the wire netting according to the present invention, the molten aluminum did not drop off but was held by the wire netting, so that the resulting wire possessed a substantially uniform outer aluminum layer. To the contrary, in the case of the comparative sample, molten aluminum drop off the sintered mass at several locations, so that the resulting outer aluminum layer had not a uniform wall thickness but varied from 0.02 mm to 0.1 mm.

The superconducting property of the samples determined by the conventional four probe method showed that the temperature where a resistance became zero was 72K in the case of the sample according to the present invention and was 71k in the case of the comparative sample.

Flexion test of the samples revealed that the sample according to the present invention broke at a curvature of 21.2 mm while the comparative sample broke at a curvature of 40 mm.

EXAMPLE 3

The same powder material and aluminum pipe as Example 2 were used and the same procedure as Example 2 was repeated except that the aluminum pipe was reduced to an outer diameter of 1.0 mm.

The test result measured by the same method as Example 2 are shown in Table 1.

TABLE 1

| Sample | Critical temperature | Breakage Curvature |
|---|---|---|
| Present invention | 70 K. | 4.8 mm |
| Comparative example | 73 K. | 10.6 mm |

What is claimed are:
1. A method for producing a sintered elongated article including the steps of:
   filling a metal pipe with a material powder,
   carrying out plastic deformation of said metal pipe filled with said material powder,
   surrounding said deformed metal pipe filled with said material powder with a netting of metallic wire whose melting point is higher than a melting point of said metal pipe, and then
   subjecting an assembly of said deformed metal pipe filled with said material powder and said netting of metallic wire to heat-treatment at a sinter temperature of said material powder, said heat-treatment causing said metal pipe to achieve a molten state, and supporting molten metal of said metal pipe by said netting of metallic wire.

2. The method set forth in claim 1, wherein said metallic wire is made of stainless steel.

3. The method set forth in claim 1, wherein said metal pipe is made of a metal selected from the group consisting of Al, Cu, Ni, Ag, Fe and their alloys.

4. The method set forth in claim 1, including performing said plastic deformation by wire-drawing by utilizing dies.

5. The method set forth in claim 1, wherein said sinter temperature is higher than said melting point of said metal pipe.

6. The method set forth in claim 1, including annealing said metal pipe during said plastic deformation.

7. The method set forth in claim 1, wherein said material powder is a powder mixture which includes a compound of an element $\alpha$ selected from IIa group of the Periodic Table, a compound of an element $\beta$ selected from IIIa group of the Periodic Table, and a compound of an element $\gamma$ selected from the group consisting of Ib, IIb, IIIb, IVa and VIIIa groups of the Periodic Table.

8. The method set forth in claim 7, wherein said material powder is a sintered powder which is prepared by sintering a powder mixture and then pulverizing the sintered powder mixture.

9. The method set forth in claim 8, including sintering said powder mixture at a temperature which is higher than 600° C. but is not higher than said melting point of said powder mixture.

10. The method set forth in claim 8, including repeating said sintering and pulverizing more than two times.

11. The method set forth in claim 7, wherein said material powder includes a compound oxide represented by the general formula:

$$(\alpha_{1-x}\beta_x)Cu_{1-y}O_z$$

in which $\alpha$ is an element selected from IIa group of the Periodic Table and $\beta$ is an element selected from IIIa group of the Periodic Table x, is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ and each satisfy ranges of $0.4 \leq y \leq 3.0$ and $1 \leq z \leq 5$ respectively.

12. The method set forth in claim 11, wherein said element $\alpha$ is Ba and said element $\beta$ is at least one element selected from the group consisting of Y, La, Gd, Dy, Ho, Er, Tm, Yb, Nd, Sm, Eu and Lu.

13. The method set forth in claim 1, wherein said powder material is a sintered powder which includes a compound oxide represented by the formula:

$$\Theta_4(\Phi_{1-q}, Ca_q)_m Cu_n O_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p=(6+m+n)$, q is a number which satisfies a range of $0 \leq q \leq 1$, and r is a number which satisfies a range of $-2 \leq r \leq +2$.

14. The method set forth in claim 1, including performing said plastic deformation by wire-drawing by utilizing roller dies.

15. The method set forth in claim 1, including performing said plastic deformation by wire-drawing by utilizing rolls.

16. The method set forth in claim 1, including performing said plastic deformation by swaging.

17. The method set forth in claim 1, including performing said plastic deformation by extrusion.

* * * * *